(12) United States Patent
Kageyama

(10) Patent No.: US 11,322,541 B2
(45) Date of Patent: May 3, 2022

(54) LIGHT-EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/002,377

(22) Filed: Aug. 25, 2020

(65) Prior Publication Data

US 2021/0066387 A1 Mar. 4, 2021

(30) Foreign Application Priority Data

Aug. 28, 2019 (JP) .............................. JP2019-155859

(51) Int. Cl.
*H01L 27/15* (2006.01)
*H01L 25/18* (2006.01)

(52) U.S. Cl.
CPC ............ *H01L 27/153* (2013.01); *H01L 25/18* (2013.01)

(58) Field of Classification Search
CPC .............................. H01L 27/153; H01L 25/18
USPC ........................................................ 257/93
See application file for complete search history.

(56) References Cited

U.S. PATENT DOCUMENTS

| | | | |
|---|---|---|---|
| 2005/0253151 A1 | 11/2005 | Sakai et al. | |
| 2011/0101390 A1* | 5/2011 | Engl | ..................... H01L 33/382 |
| | | | 257/93 |
| 2016/0079483 A1 | 3/2016 | Obata et al. | |

FOREIGN PATENT DOCUMENTS

| | | | |
|---|---|---|---|
| JP | 2004-006582 A | 1/2004 |
| JP | 2005-051134 A | 2/2005 |
| JP | 2011-513957 A | 4/2011 |
| JP | 2015-177181 A | 10/2015 |
| JP | 2016-062940 A | 4/2016 |

* cited by examiner

*Primary Examiner* — Tong-Ho Kim
(74) *Attorney, Agent, or Firm* — Foley & Lardner LLP

(57) ABSTRACT

A light-emitting device includes: a circuit board; and a light-emitting element mounted on the circuit board, the light-emitting element including: a substrate provided on the circuit board, the substrate having a first side along a first direction and a second side along the first direction, wherein a second direction from the first side toward the second side being is orthogonal to the first direction; n semiconductor stacked bodies (n being a natural number of 2 or more) provided on the substrate, the n semiconductor stacked bodies comprising a first semiconductor stacked body and a second semiconductor stacked body that are electrically insulated from each other; and n+1 interconnect layers.

17 Claims, 10 Drawing Sheets

LIGHT-EMITTING DEVICE

CROSS-REFERENCE TO RELATED APPLICATION

This application claims priority to Japanese Patent Application No. 2019-155859, filed on Aug. 28, 2019, the disclosure of which is hereby incorporated by reference in its entirety.

BACKGROUND

The present disclosure relates to a light-emitting device.

For example, a multi-chip package discussed in Japanese Patent Publication No. 2016-62940 has a structure in which multiple chips are electrically connected to each other by interconnect layers inside the package.

SUMMARY

According to certain embodiment of the present disclosure, a light-emitting device having multiple semiconductor stacked bodies that can be controlled individually by using a relatively simple interconnect structure.

In an embodiment of the present disclosure, a light-emitting device includes a circuit board and a light-emitting element mounted on the circuit board. The light-emitting element includes a substrate, n semiconductor stacked bodies (n being a natural number of 2 or more), n+1 interconnect layers, and n+1 pad electrodes. The substrate is provided on the circuit board. The substrate has a first side along a first direction and a second side along the first direction. A second direction from the first side toward the second side is orthogonal to the first direction. The n semiconductor stacked bodies are provided on the substrate. The n semiconductor stacked bodies include a first semiconductor stacked body and a second semiconductor stacked body electrically insulated from each other. Each of the semiconductor stacked bodies includes a first semiconductor layer of a first conductivity type, a second semiconductor layer of a second conductivity type, and a light-emitting layer provided between the first semiconductor layer and the second semiconductor layer. The first semiconductor stacked body is provided between the first side and the second semiconductor stacked body in a top-view. The second semiconductor stacked body is provided between the first semiconductor stacked body and the second side in a top-view. The n+1 interconnect layers include at least a first interconnect layer connected to the first semiconductor layer of the first semiconductor stacked body, a second interconnect layer connected to the second semiconductor layer of the first semiconductor stacked body and the first semiconductor layer of the second semiconductor stacked body, and a third interconnect layer connected to the second semiconductor layer of the second semiconductor stacked body. The n+1 pad electrodes are provided between the first side and the first semiconductor stacked body. The n+1 pad electrodes include a first pad electrode connected to the first interconnect layer, a second pad electrode connected to the second interconnect layer, and a third pad electrode connected to the third interconnect layer.

According to certain embodiment of the present disclosure, a light-emitting device having multiple semiconductor stacked bodies that can be controlled individually by using a relatively simple interconnect structure can be provided.

DETAILED DESCRIPTION

Figure 1:
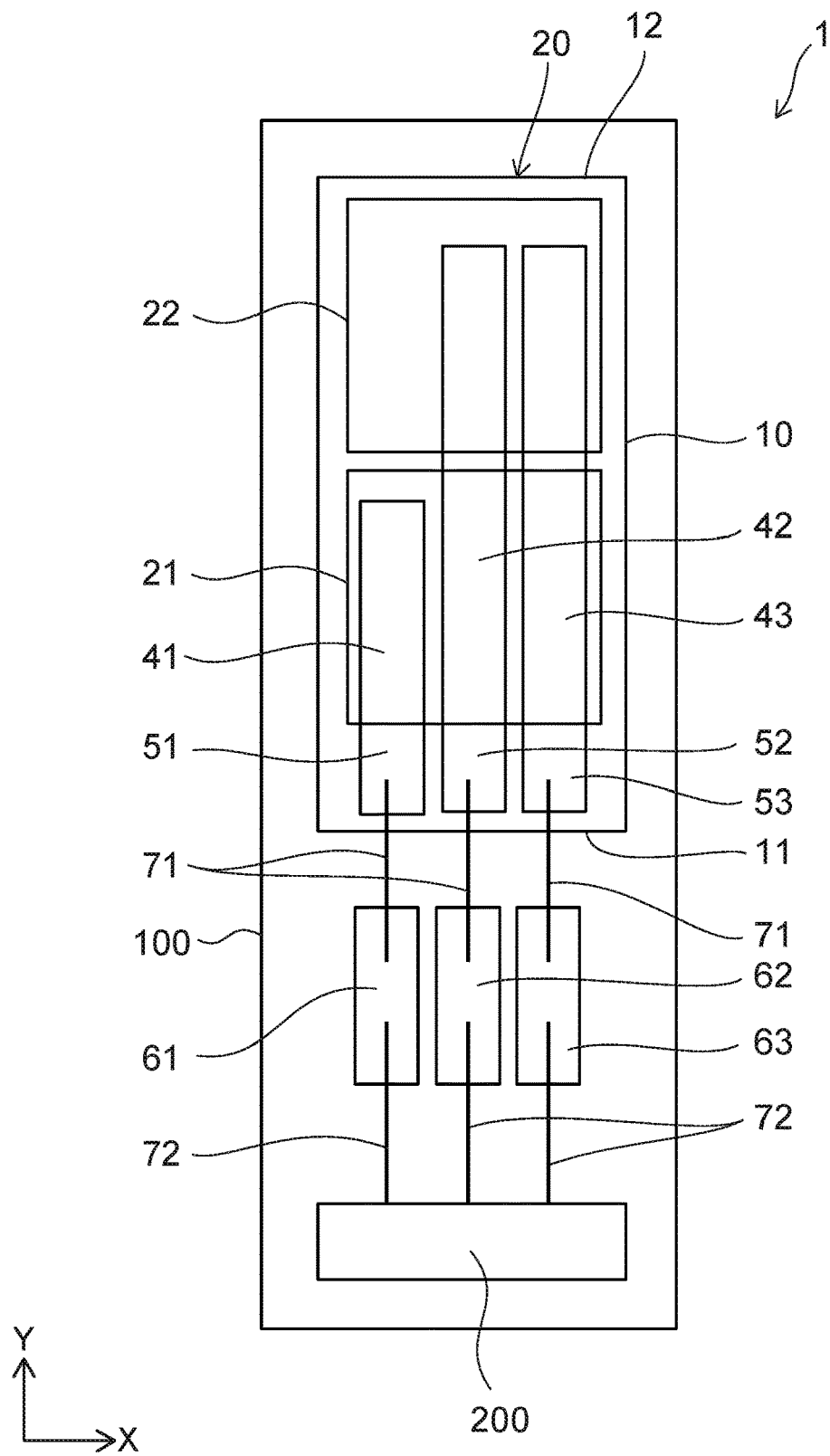
FIG. 1 is a schematic plan view showing an arrangement relationship of main components of a light-emitting device of an embodiment of the invention.

Embodiments will now be described with reference to the drawings. The same components in the drawings are labeled with the same reference numerals.

FIG. 1 is a schematic plan view showing the arrangement relationship of the main components of a light-emitting device 1 of an embodiment of the invention.

The light-emitting device 1 includes a circuit board 100, and a light-emitting element 20 mounted on the circuit board 100. The light-emitting element 20 includes a substrate 10, n semiconductor stacked bodies (n being a natural number of 2 or more), n+1 interconnect layers, and n+1 pad electrodes. FIG. 1 is an example of a light-emitting device in which n is 2, and the light-emitting element 20 includes two semiconductor stacked bodies (a first semiconductor stacked body 21 and a second semiconductor stacked body 22), three interconnect layers (a first interconnect layer 41, a second interconnect layer 42, and a third interconnect layer 43), and three pad electrodes (a first pad electrode 51, a second pad electrode 52, and a third pad electrode 53).

The substrate 10 of the light-emitting element 20 is provided on the circuit board 100. The first semiconductor stacked body 21, the second semiconductor stacked body 22, the first interconnect layer 41, the second interconnect layer 42, the third interconnect layer 43, the first pad electrode 51, the second pad electrode 52, and the third pad electrode 53 are provided on the substrate 10.

The substrate 10 has a first side 11 along a first direction X, and a second side 12 along the first direction X. A second direction Y from the first side 11 toward the second side 12 is orthogonal to the first direction X. A side that is along the first direction X is a side that includes a portion parallel to the first direction X. A side that is along the second direction Y is a side that includes a portion parallel to the second direction Y.

The first semiconductor stacked body 21 and the second semiconductor stacked body 22 are separated from each other on the substrate 10 and are electrically insulated from each other. In a top-view shown in FIG. 1, the first semiconductor stacked body 21 is provided between the second semiconductor stacked body 22 and the first side 11 of the substrate 10. The second semiconductor stacked body 22 is provided between the first semiconductor stacked body 21 and the second side 12 of the substrate 10.

The light-emitting element 20 will now be described.

Figure 2:
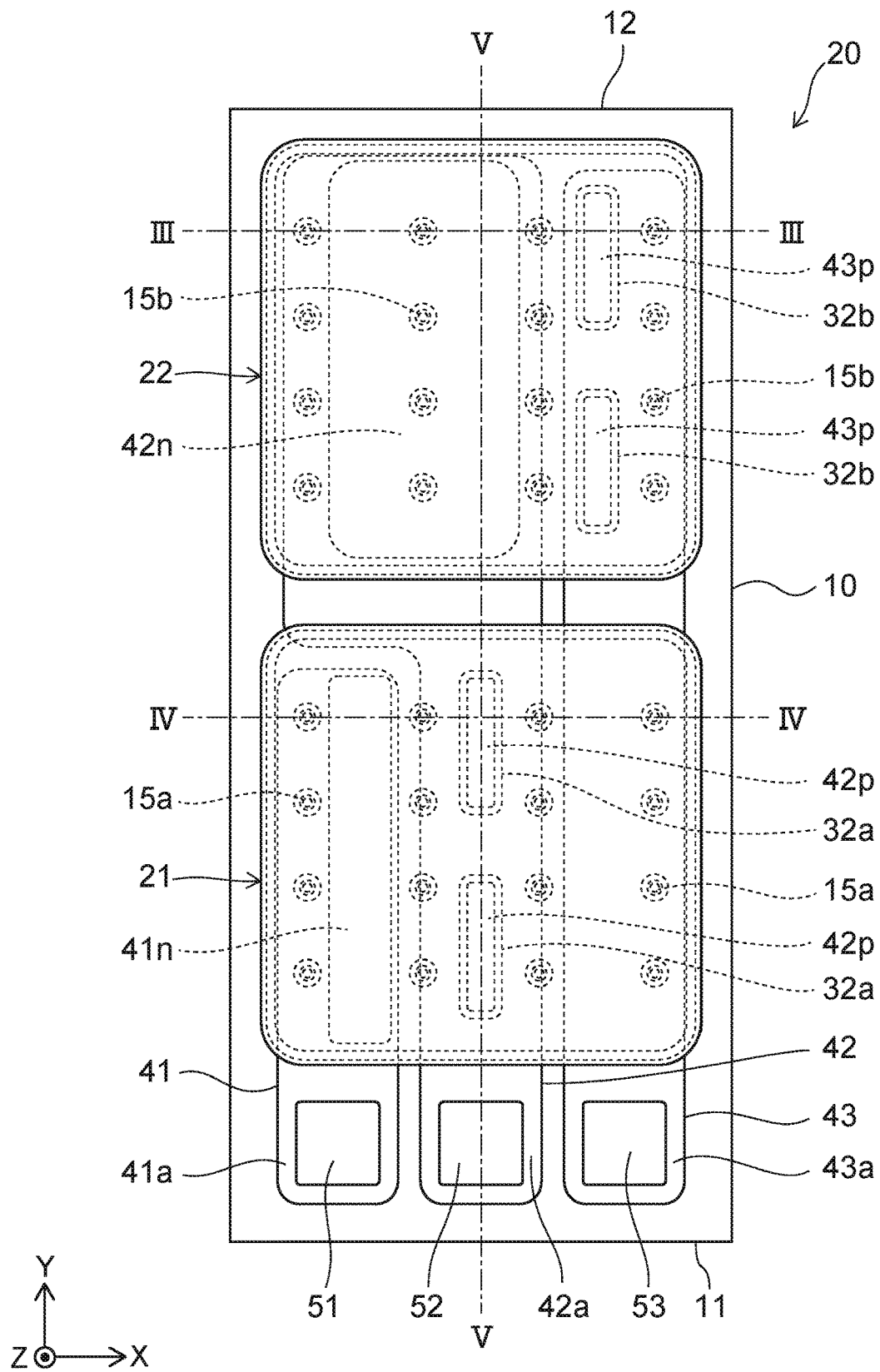
FIG. 2 is a schematic plan view of a light-emitting element of the light-emitting device shown in FIG. 1.
Figure 3:
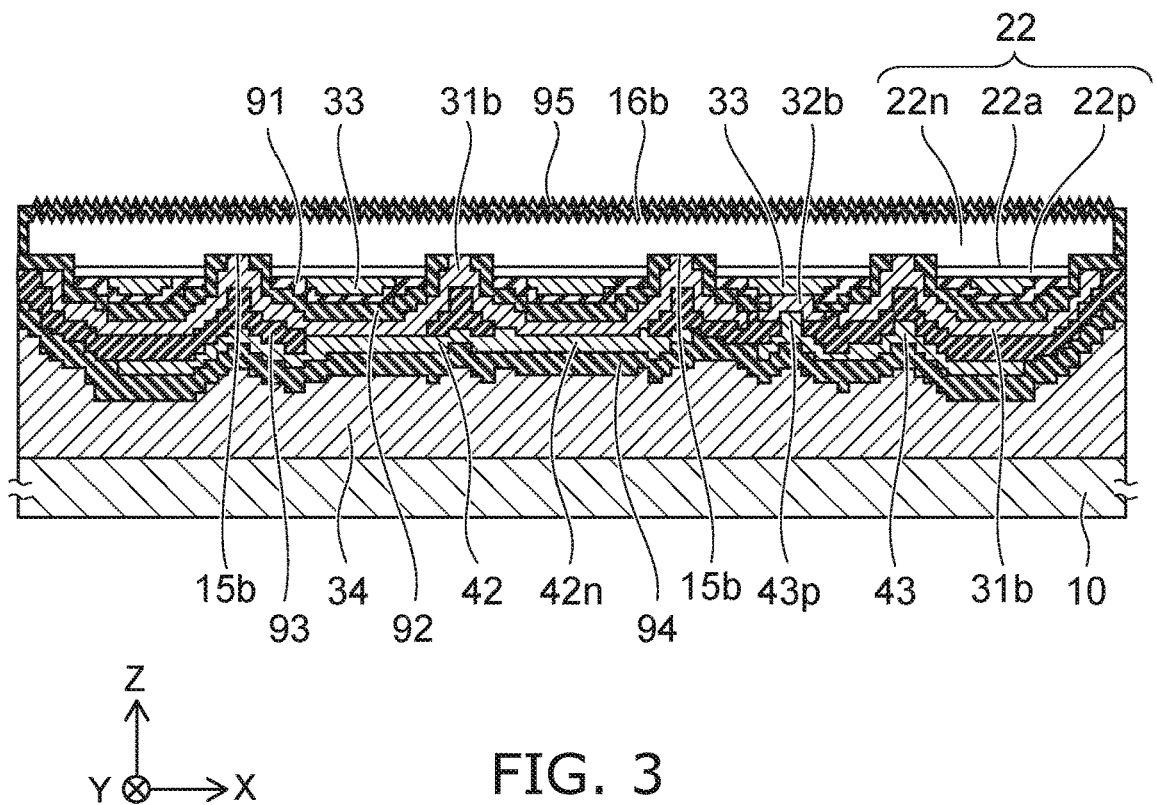
FIG. 3 is a schematic cross-sectional view along line III-III of FIG. 2.
Figure 4:
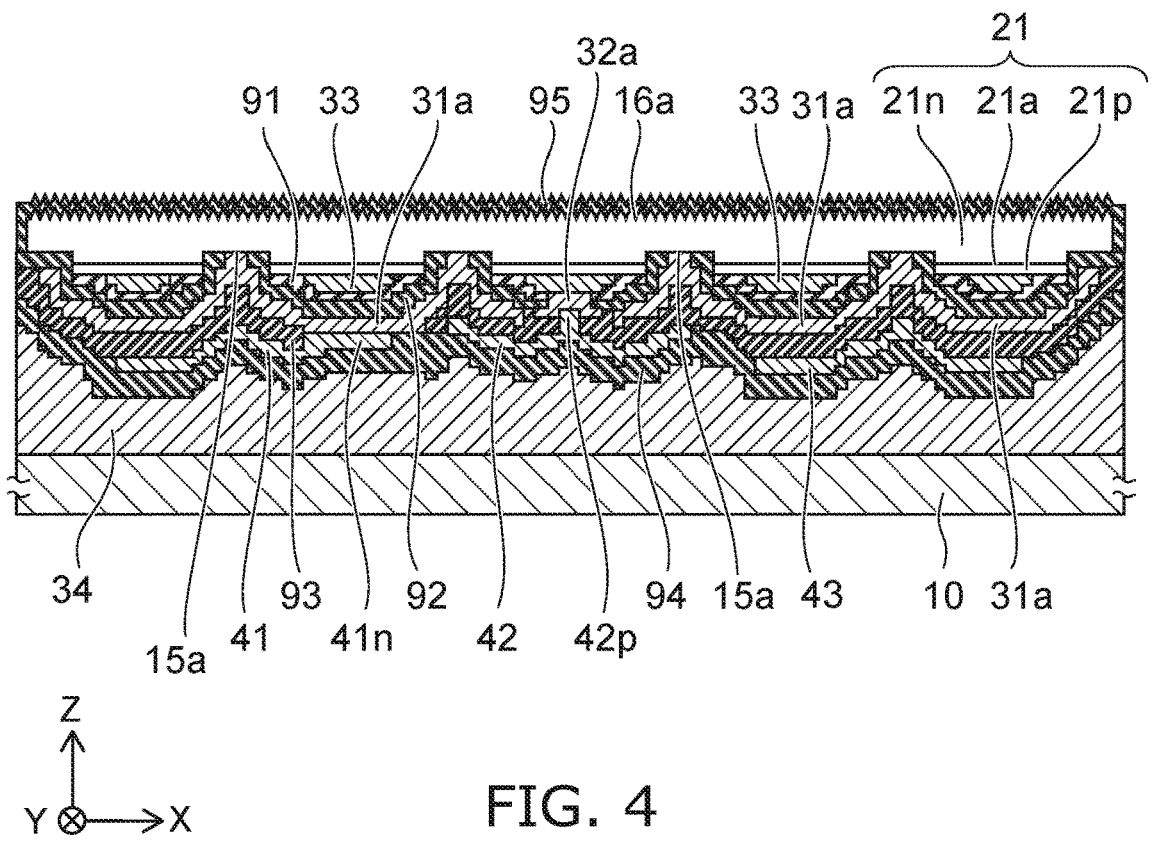
FIG. 4 is a schematic cross-sectional view along line IV-IV of FIG. 2.
Figure 5:
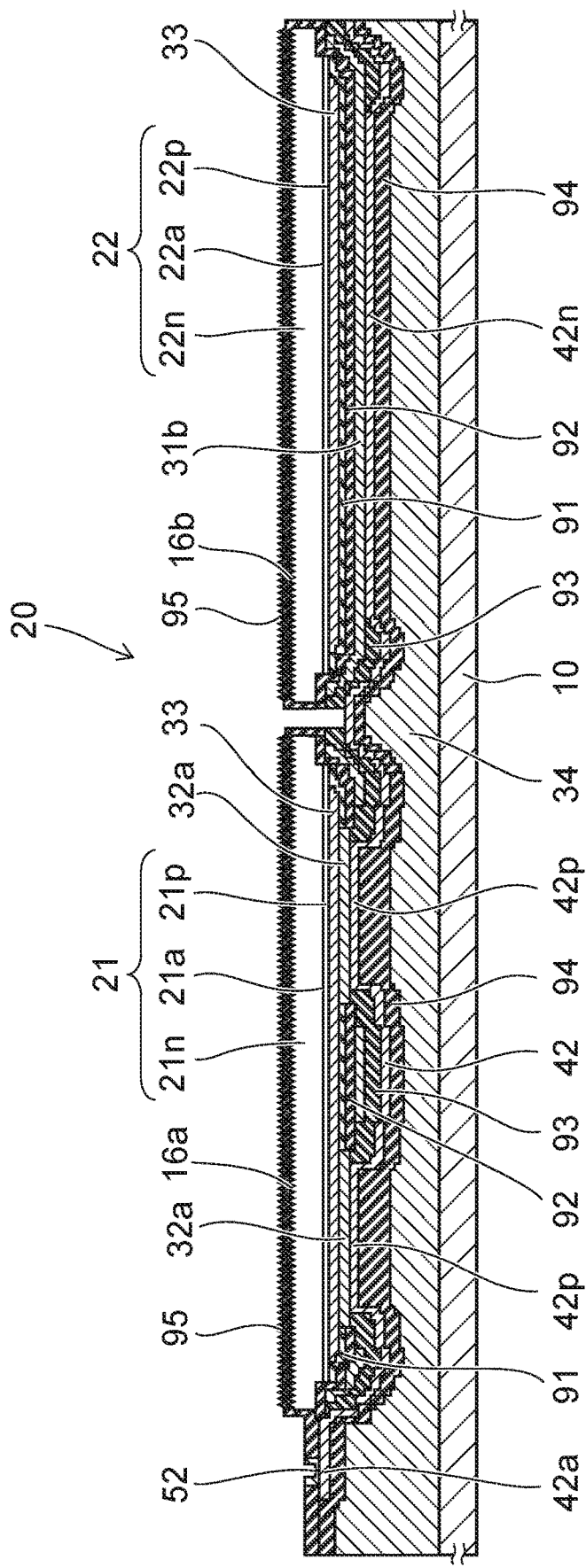
FIG. 5 is a schematic cross-sectional view along line V-V of FIG. 2.

FIG. 2 is a schematic plan view of the light-emitting element 20. FIG. 3 is a schematic cross-sectional view along line III-III of FIG. 2. FIG. 4 is a schematic cross-sectional view along line IV-IV of FIG. 2. FIG. 5 is a schematic cross-sectional view along line V-V of FIG. 2.

In the description hereinbelow, a first conductivity type is taken as an n-type, and a second conductivity type is taken as a p-type. The first conductivity type may be the p-type, and the second conductivity type may be the n-type.

As shown in FIG. 4 and FIG. 5, the first semiconductor stacked body 21 includes a first semiconductor layer 21n of the n-type, a light-emitting layer 21a, and a second semiconductor layer 21p of the p-type. The light-emitting layer 21a is provided between the first semiconductor layer 21n and the second semiconductor layer 21p in a third direction Z. The third direction Z is orthogonal to the first direction X and the second direction Y.

As shown in FIG. 3 and FIG. 5, the second semiconductor stacked body 22 includes a first semiconductor layer 22n of the n-type, a light-emitting layer 22a, and a second semiconductor layer 22p of the p-type. The light-emitting layer 22a is provided between the first semiconductor layer 22n and the second semiconductor layer 22p in the third direction Z.

Figure 6:
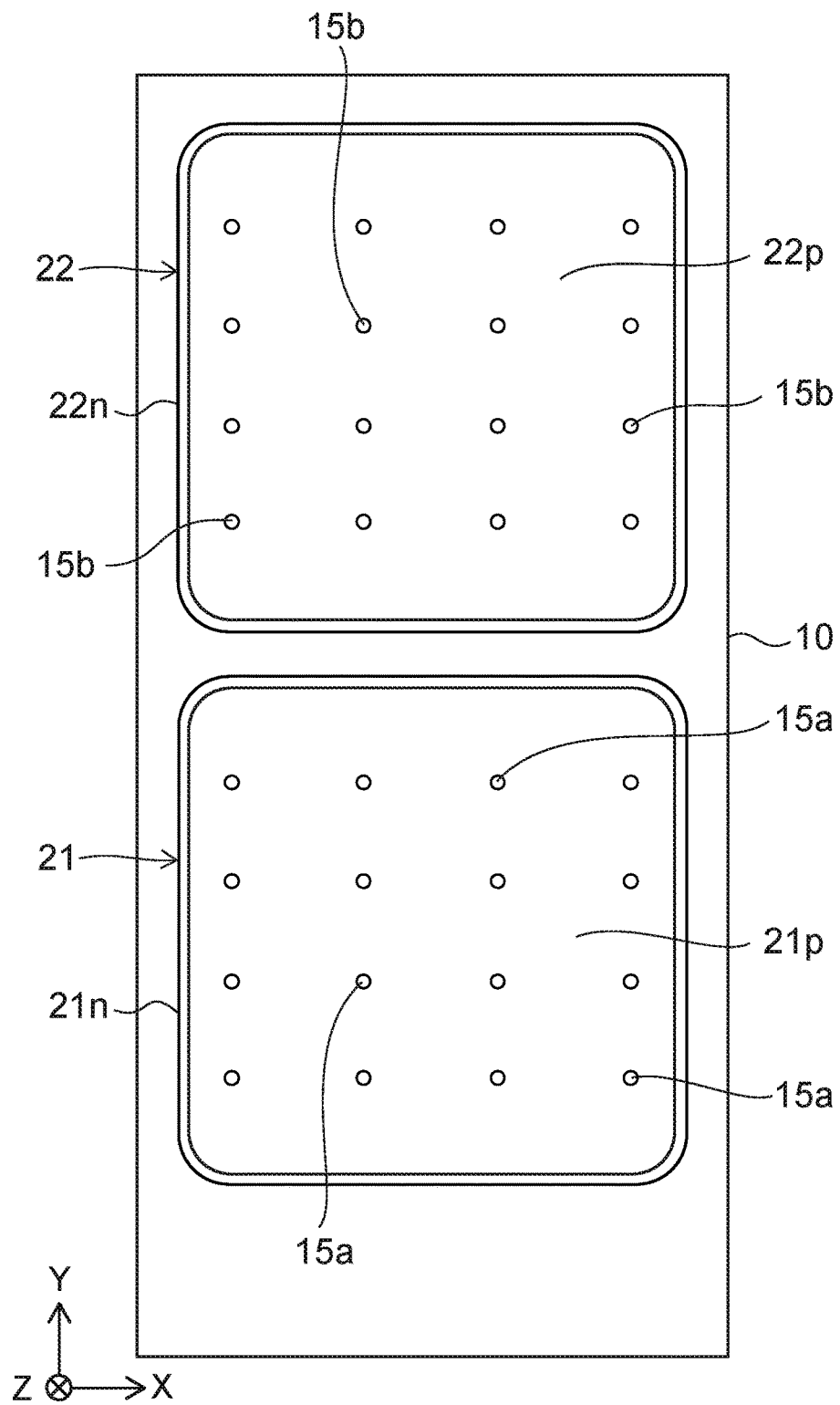
FIG. 6 is a schematic plan view of a first semiconductor stacked body and a second semiconductor stacked body of the light-emitting element shown in FIG. 2.

FIG. 6 is a schematic plan view of the first semiconductor stacked body 21 and the second semiconductor stacked body 22.

The first semiconductor layer 21n of the first semiconductor stacked body 21 includes multiple island-shaped conduction portions 15a. The light-emitting layer 21a and the second semiconductor layer 21p are not provided at the conduction portions 15a. In a plan-view shown in FIG. 6, the peripheries of the conduction portions 15a are surrounded with the second semiconductor layer 21p.

The first semiconductor layer 22n of the second semiconductor stacked body 22 includes multiple island-shaped conduction portions 15b. The light-emitting layer 22a and the second semiconductor layer 22p are not provided at the conduction portions 15b. In a plan-view shown in FIG. 6, the peripheries of the conduction portions 15b are surrounded with the second semiconductor layer 22p.

Figure 7:
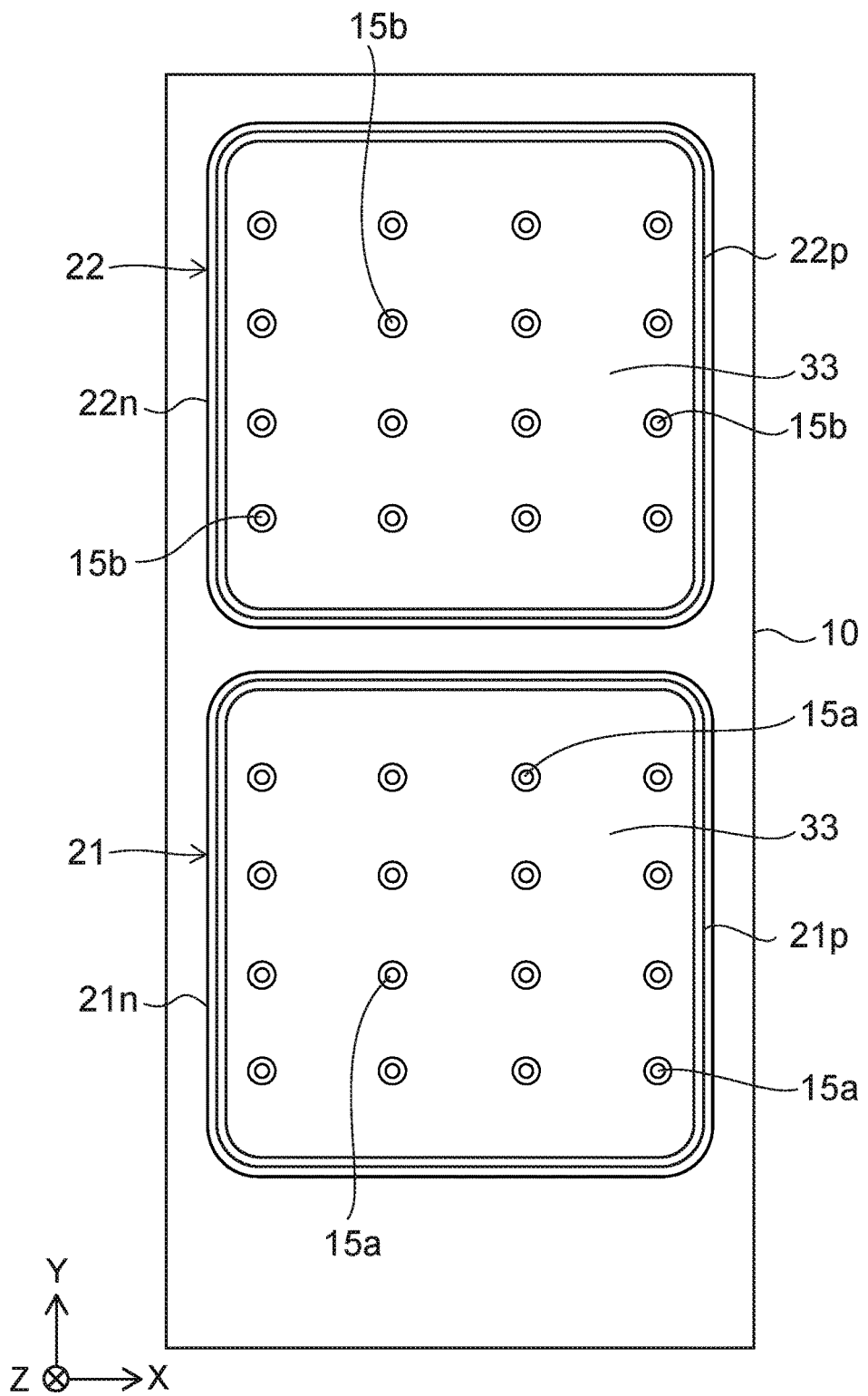
FIG. 7 is a schematic plan view in which a reflective film is added to a configuration shown in FIG. 6.

FIG. 7 is a schematic plan view in which a reflective film 33 is added to the configuration shown in FIG. 6.

The reflective film 33 is provided at the surface of the second semiconductor layer 21p of the first semiconductor stacked body 21. The reflective film 33 is provided at the surface of the second semiconductor layer 22p of the second semiconductor stacked body 22. The reflective film 33 is reflective to light emitted by the light-emitting layer 21a and the light-emitting layer 22a and includes, for example, Ag or Al. Also, the reflective film 33 is conductive. The reflective film 33 has multiple openings in the regions overlapping the portions where the conduction portions 15a and the conduction portions 15b are provided, and the conduction portions 15a and the conduction portions 15b are not covered with the reflective film 33.

As shown in FIG. 3 and FIG. 5, an insulating film 91 is provided at the surface of the second semiconductor layer 22p and the surface of the reflective film 33. As shown in FIG. 4 and FIG. 5, the insulating film 91 is provided at the reflective film 33 and the surface of the second semiconductor layer 21p.

As shown in FIG. 3, an insulating film 92 is provided at the surface of the insulating film 91, the side surface of the second semiconductor layer 22p, the side surface of the light-emitting layer 22a, and some of the conduction portions 15b. As shown in FIG. 4, the insulating film 92 is provided at the surface of the insulating film 91, the side surface of the second semiconductor layer 21p, the side surface of the light-emitting layer 21a, and some of the conduction portions 15a.

As shown in FIG. 4, a first electrode 31a and a second electrode 32a are provided on the first semiconductor stacked body 21 (in FIG. 4, at the lower surface of the first semiconductor stacked body 21). The first electrode 31a is connected to the conduction portions 15a of the first semiconductor layer 21n of the first semiconductor stacked body 21 not covered with the insulating film 92. The second electrode 32a is provided on the second semiconductor layer 21p and connected to a portion of the reflective film 33 not covered with the insulating films 91 and 92.

The first electrode 31a is electrically connected to the first semiconductor layer 21n of the first semiconductor stacked body 21 via the conduction portions 15a. The second electrode 32a is electrically connected to the second semiconductor layer 21p of the first semiconductor stacked body 21 via the reflective film 33.

As shown in FIG. 3, a first electrode 31b and a second electrode 32b are provided on the second semiconductor stacked body 22 (in FIG. 3, at the lower surface of the second semiconductor stacked body 22). The first electrode 31b is connected to the conduction portions 15b of the first semiconductor layer 22n of the second semiconductor stacked body 22 not covered with the insulating film 92. The second electrode 32b is provided on the second semiconductor layer 21p and connected to a portion of the reflective film 33 not covered with the insulating films 91 and 92.

The first electrode 31b is electrically connected to the first semiconductor layer 22n of the second semiconductor stacked body 22 via the conduction portions 15b. The second electrode 32b is electrically connected to the second semiconductor layer 22p of the second semiconductor stacked body 22 via the reflective film 33.

The first electrode 31a, the second electrode 32a, the first electrode 31b, and the second electrode 32b are separated and electrically insulated from each other.

As shown in FIG. 4, the first interconnect layer 41, the second interconnect layer 42, and the third interconnect layer 43 are provided between the substrate 10 and the first semiconductor stacked body 21 in the third direction Z. An insulating film 93 is provided at the surfaces of the first electrode 31a and the second electrode 32a. The first interconnect layer 41, the second interconnect layer 42, and the third interconnect layer 43 are provided on the insulating film 93 (in FIG. 4, at the lower surface of the insulating film 93).

The first interconnect layer 41 includes a first connection portion 41n connected to the first electrode 31a not covered with the insulating film 93. The first interconnect layer 41 is not connected to the second electrode 32a. The second interconnect layer 42 includes a second connection portion 42p connected to the second electrode 32a not covered with the insulating film 93. The second interconnect layer 42 is not connected to the first electrode 31a. The third interconnect layer 43 is not connected to the first electrode 31a and the second electrode 32a.

As shown in FIG. 3, the second interconnect layer 42 and the third interconnect layer 43 are provided between the substrate 10 and the second semiconductor stacked body 22 in the third direction Z. The insulating film 93 is provided at the surfaces of the first electrode 31b and the second electrode 32b. The second interconnect layer 42 and the third interconnect layer 43 are provided on the insulating film 93 (in FIG. 3, at the lower surface of the insulating film 93).

The second interconnect layer 42 includes a third connection portion 42n connected to the first electrode 31b not covered with the insulating film 93. The second interconnect layer 42 is not connected to the second electrode 32b. The third interconnect layer 43 includes a fourth connection portion 43p connected to the second electrode 32b not covered with the insulating film 93. The third interconnect layer 43 is not connected to the first electrode 31b.

The first interconnect layer 41 is electrically connected to the first semiconductor layer 21n of the first semiconductor stacked body 21 via the first electrode 31a. The second interconnect layer 42 is electrically connected to the second semiconductor layer 21p of the first semiconductor stacked body 21 via the second electrode 32a and electrically connected to the first semiconductor layer 22n of the second semiconductor stacked body 22 via the first electrode 31b. The third interconnect layer 43 is electrically connected to the second semiconductor layer 22p of the second semiconductor stacked body 22 via the second electrode 32b.

As shown in FIG. 2, the first interconnect layer 41 includes a first pad connection portion 41a, the second interconnect layer 42 includes a second pad connection portion 42a, and the third interconnect layer 43 includes a third pad connection portion 43a. In a top-view shown in FIG. 2, the first pad connection portion 41a, the second pad connection portion 42a, and the third pad connection portion 43a are positioned between the first semiconductor stacked body 21 and the first side 11 of the substrate 10. The first pad connection portion 41a, the second pad connection portion 42a, and the third pad connection portion 43a do not overlap the first semiconductor stacked body 21 and the second semiconductor stacked body 22 in the third direction Z.

The first pad electrode 51 is provided on the first pad connection portion 41a. The second pad electrode 52 is provided on the second pad connection portion 42a. The third pad electrode 53 is provided on the third pad connection portion 43a.

As shown in FIG. 2, a width of the second interconnect layer 42 in the first direction X that provided at the second semiconductor stacked body 22 is greater than a width of the second interconnect layer 42 in the first direction X that provided at the first semiconductor stacked body 21. In the second direction Y, a portion of the second interconnect layer 42 is next to the region where the first interconnect layer 41 is provided, and the portion of the second interconnect layer 42 is electrically connected to the first electrode 31b as shown in FIG. 3. Because the conduction portions with the first electrode 31b are provided by providing the second interconnect layer 42 in a wider area of the second semiconductor stacked body 22, the current can be diffused in a wider area of the second semiconductor stacked body 22, and uneven luminance can be reduced.

As shown in FIGS. 3 to 5, an insulating film 94 is provided at the surfaces of the first interconnect layer 41, the second interconnect layer 42, and the third interconnect layer 43. The structure body that is on the insulating film 94 is bonded to the substrate 10 by a bonding layer 34. The bonding layer 34 is, for example, a solder material such as Au—Sn, Cu—Sn, or the like, a metal layer formed by plating, etc.

An upper surface 16a of the first semiconductor layer 21n of the first semiconductor stacked body 21 and an upper surface 16b of the first semiconductor layer 22n of the second semiconductor stacked body 22 have uneven configurations, and an insulating film 95 is provided at the upper surfaces 16a and 16b. An uneven configuration that corresponds to the upper surfaces 16a and 16b is formed also in the surface of the insulating film 95. The insulating film 95 also covers the side surface of the first semiconductor stacked body 21 and the side surface of the second semiconductor stacked body 22.

As shown in FIG. 1, a first power supply terminal 61, a second power supply terminal 62, and a third power supply terminal 63 are provided on the circuit board 100. The first power supply terminal 61 is electrically connected to the first pad electrode 51 by a conductive member 71. The second power supply terminal 62 is electrically connected to the second pad electrode 52 by the conductive member 71. The third power supply terminal 63 is electrically connected to the third pad electrode 53 by the conductive member 71. The conductive member 71 is, for example, a metal wire. Alternatively, the conductive member 71 may be a conductor pattern formed on the circuit board 100.

Other than the light-emitting element 20, a control element 200 is mounted on the circuit board 100. The control element 200 controls the driving of the light-emitting element 20. The control element 200 is electrically connected to the first power supply terminal 61, the second power supply terminal 62, and the third power supply terminal 63 by a conductive member 72. The conductive member 72 is, for example, a metal wire. Alternatively, the conductive member 72 may be a conductor pattern formed on the circuit board 100.

The first semiconductor stacked body 21 and the second semiconductor stacked body 22 are connected in series between the first power supply terminal 61 and the third power supply terminal 63.

By supplying a current by applying potential differences between any two power supply terminals of the first power supply terminal 61, the second power supply terminal 62, or the third power supply terminal 63, one or both of the light-emitting layer 21a of the first semiconductor stacked body 21 or the light-emitting layer 22a of the second semiconductor stacked body 22 can be caused to emit light.

A first potential may be applied to the third power supply terminal 63, a second potential that is less than the first potential may be applied to the first power supply terminal 61, and the potential of the second power supply terminal 62 may be floating. By such a control, a current flows from the third power supply terminal 63 toward the first power supply terminal 61 via the third pad electrode 53, the third interconnect layer 43, the light-emitting layer 22a of the second semiconductor stacked body 22, the second interconnect layer 42, the light-emitting layer 21a of the first semiconductor stacked body 21, the first interconnect layer 41, and the first pad electrode 51. Thereby, the light-emitting layer 21a of the first semiconductor stacked body 21 and the light-emitting layer 22a of the second semiconductor stacked body 22 simultaneously emit light.

The light that is emitted by the light-emitting layer 21a is extracted to the outside mainly from the upper surface 16a of the first semiconductor stacked body 21. The light that is emitted by the light-emitting layer 22*a* is extracted to the outside mainly from the upper surface 16*b* of the second semiconductor stacked body 22.

The first potential may be applied to the second power supply terminal 62, the second potential that is less than the first potential may be applied to the first power supply terminal 61, and the potential of the third power supply terminal 63 may be floating. By such a control, a current flows from the second power supply terminal 62 toward the first power supply terminal 61 via the second pad electrode 52, the second interconnect layer 42, the light-emitting layer 21*a* of the first semiconductor stacked body 21, the first interconnect layer 41, and the first pad electrode 51. Thereby, the light-emitting layer 21*a* of the first semiconductor stacked body 21 emits light. A current is not supplied to the light-emitting layer 22*a* of the second semiconductor stacked body 22, and the light-emitting layer 22*a* of the second semiconductor stacked body 22 does not emit light.

The first potential may be applied to the third power supply terminal 63, the second potential that is less than the first potential may be applied to the second power supply terminal 62, and the potential of the first power supply terminal 61 may be floating. By such a control, a current flows from the third power supply terminal 63 toward the second power supply terminal 62 via the third pad electrode 53, the third interconnect layer 43, the light-emitting layer 22*a* of the second semiconductor stacked body 22, the second interconnect layer 42, and the second pad electrode 52. Thereby, the light-emitting layer 22*a* of the second semiconductor stacked body 22 emits light. A current is not supplied to the light-emitting layer 21*a* of the first semiconductor stacked body 21, and the light-emitting layer 21*a* of the first semiconductor stacked body 21 does not emit light.

According to the embodiment, the control of the individual light emission or the simultaneous light emission of the multiple semiconductor stacked bodies 21 and 22 is possible using a simple interconnect structure in which the three interconnect layers 41, 42, and 43 are used for the two semiconductor stacked bodies 21 and 22; that is, one more interconnect layer than the number of the semiconductor stacked bodies 21 and 22 is used. For example, the interconnect structure can be simplified compared to the case where a pair of interconnect layers for the anode side and the cathode side is provided for each of the semiconductor stacked bodies 21 and 22.

The first semiconductor stacked body 21 and the second semiconductor stacked body 22 are electrically connected to each other via the second interconnect layer 42 that is provided on the same substrate 10 supporting the first semiconductor stacked body 21 and the second semiconductor stacked body 22. According to such a structure, the first semiconductor stacked body 21 and the second semiconductor stacked body 22 can be proximate to each other in one light-emitting element 20. Therefore, the mounting space of the light-emitting element 20 on the circuit board 100 can be more compact than when two light-emitting elements are singulated one at a time and mounted on the circuit board 100.

In a top-view shown in FIG. 1 and FIG. 2, the first pad electrode 51, the second pad electrode 52, and the third pad electrode 53 are located between the first semiconductor stacked body 21 and the first side 11 of the substrate 10. According to such a structure, for example, compared to a reference example in which the semiconductor stacked bodies 21 and 22 are sandwiched between multiple pad electrodes, the planar size of the entire light-emitting element 20 can be less than that of the reference example even for the same light emission area. Alternatively, because the space where the pad electrodes are located can be reduced for the same planar size of the entire light-emitting element 20, the light emission area can be increased compared to the reference example. Moreover, by locating all of the pad electrodes proximately to the first side 11, the multiple power supply terminals and the control element 200 can be located proximately to the first side, and the arrangement of the members on the circuit board 100 can be simplified.

As shown in FIG. 1, the first interconnect layer 41, the second interconnect layer 42, and the third interconnect layer 43 are arranged in the first direction X, and the second interconnect layer 42 is positioned between the first interconnect layer 41 and the third interconnect layer 43. The first pad electrode 51, the second pad electrode 52, and the third pad electrode 53 are arranged in the first direction X, and the second pad electrode 52 is positioned between the first pad electrode 51 and the third pad electrode 53. The first power supply terminal 61, the second power supply terminal 62, and the third power supply terminal 63 are arranged in the first direction X, and the second power supply terminal 62 is positioned between the first power supply terminal 61 and the third power supply terminal 63.

By such an arrangement relationship, individual control can be performed while further simplifying the interconnect structure for the first semiconductor stacked body 21 and the second semiconductor stacked body 22.

Figure 8:
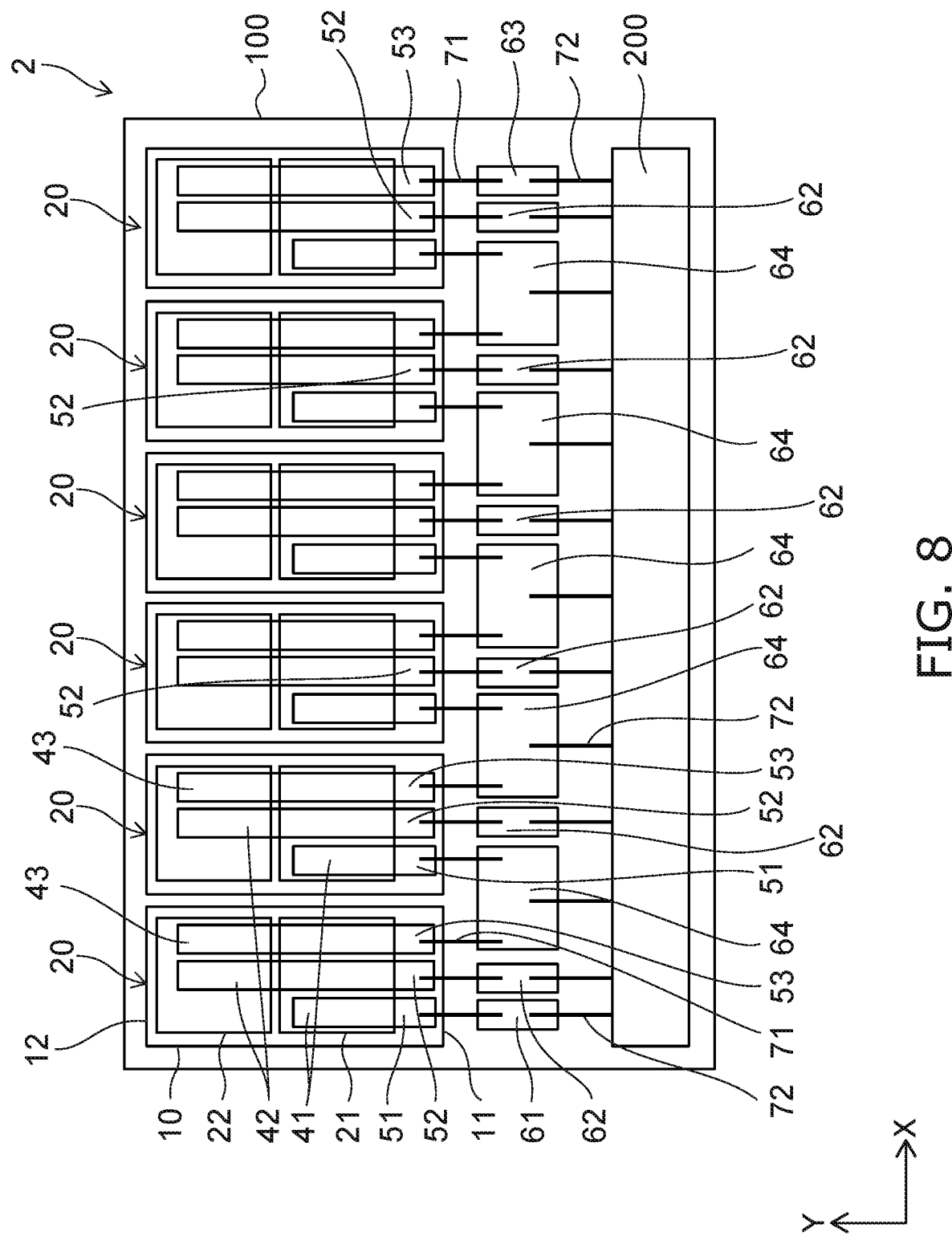
FIG. 8 is a schematic plan view showing an arrangement relationship of main components of a light-emitting device of another embodiment of the invention.

FIG. 8 is a schematic plan view showing the arrangement relationship of the main components of a light-emitting device 2 including multiple light-emitting elements 20.

The multiple light-emitting elements 20 are mounted on the circuit board 100 and arranged along the first direction X. Each of the light-emitting elements 20 has the structure shown in FIG. 2 to FIG. 7 described above. The first pad electrode 51, the second pad electrode 52, and the third pad electrode 53 are provided in each of the light-emitting elements 20.

A power supply terminal 61 that is electrically connected to the first pad electrode 51, a power supply terminal 62 that is electrically connected to the second pad electrode 52, a power supply terminal 63 that is electrically connected to the third pad electrode 53, and a power supply terminal 64 that is electrically connected to the first pad electrode 51 and the third pad electrode 53 are provided on the circuit board 100. The control element 200 is also mounted on the circuit board 100, and the control element 200 is electrically connected to the power supply terminals 61, 62, 63, and 64 via the conductive members 72.

The multiple power supply terminals 61, 62, 63, and 64 are arranged along the first direction X; the power supply terminal 61 is located at one end (the left end); the power supply terminal 63 is located at the other end (the right end). The first pad electrode 51 of the light-emitting element 20 located at the one end (the left end) in the first direction X is connected to the power supply terminal 61 at the left end, and the third pad electrode 53 of the light-emitting element 20 located at the other end (the right end) is connected to the power supply terminal 63 at the right end.

The second pad electrodes 52 of the light-emitting elements 20 are connected to the power supply terminals 62. The third pad electrode 53 of one of two light-emitting elements 20 next to each other in the first direction X and the first pad electrode 51 of the other of the two light-emitting elements 20 are connected to the same power supply terminal 64. In other words, the second semiconductor layer 22*p* of the second semiconductor stacked body 22 of the one of the two light-emitting elements 20 next to each other in the first direction X and the first semiconductor layer 21*n* of the first semiconductor stacked body 21 of the other of the two light-emitting elements 20 are electrically connected via the third interconnect layer 43 of the one of the two light-emitting elements 20, the power supply terminal 64, and the first interconnect layer 41 of the other of the two light-emitting elements 20.

The number of power supply terminals, the number of the conductive members 72 connecting the control element 200 and the power supply terminals, and the number of terminals of the control element 200 can be reduced by commonly using the power supply terminal 64 between the two light-emitting elements 20 next to each other in the first direction X. The individual control by the control element 200 is simplified further because the multiple light-emitting elements 20 are connected in series by the multiple interconnect layers and the multiple power supply terminals.

The pad electrodes 51, 52, and 53 are located between the first semiconductor stacked body 21 and the first side 11 of the substrate 10 of the light-emitting element 20 for all of the light-emitting elements 20. Thereby, the multiple semiconductor stacked bodies 21 and 22 of the multiple light-emitting elements 20 can be densely located, and it is possible to form a wide light-emitting region in which the uneven luminance is low.

The multiple semiconductor stacked bodies 21 and 22 of the multiple light-emitting elements 20 are connected in series by the multiple interconnect layers 41, 42, and 43 and the multiple power supply terminals 61, 62, 63, and 64. An example will now be described with reference to FIG. 8 in which the light-emitting layer of any semiconductor stacked body of the semiconductor stacked bodies 21 and 22 for each light-emitting element 20 is caused to emit light by applying a potential difference between any two power supply terminals of the multiple power supply terminals 61, 62, 63, and 64.

In FIG. 8, by applying the first potential to the power supply terminal 63 located at the right end, applying the second potential that is less than the first potential to the power supply terminal 61 located at the left end, and setting the potentials of the other power supply terminals to be floating, a current is supplied to the light-emitting layers 21*a* and 22*a* of the semiconductor stacked bodies 21 and 22 of all of the multiple light-emitting elements 20, and the light-emitting layers 21*a* and 22*a* of all of the multiple light-emitting elements 20 can be caused to emit light simultaneously.

In FIG. 8, the light-emitting layer 21*a* of the first semiconductor stacked body 21 of the light-emitting element 20 at the left end can be caused to emit light by causing a current to flow between the power supply terminal 61 located at the left end and the power supply terminal 62 located next to the power supply terminal 61.

In FIG. 8, the light-emitting layer 22*a* of the second semiconductor stacked body 22 of the light-emitting element 20 at the left end can be caused to emit light by causing a current to flow between the power supply terminal 62 connected to the second pad electrode 52 of the light-emitting element 20 located at the left end and the power supply terminal 64 located next to the power supply terminal 62.

In FIG. 8, the light-emitting layer 22*a* of the second semiconductor stacked body 22 of the light-emitting element 20 at the right end can be caused to emit light by causing a current to flow between the power supply terminal 63 at the right end and the power supply terminal 62 located next to the power supply terminal 63.

In FIG. 8, the light-emitting layer 21*a* of the first semiconductor stacked body 21 of the light-emitting element 20 at the right end can be caused to emit light by causing a current to flow between the power supply terminal 62 connected to the second pad electrode 52 of the light-emitting element 20 located at the right end and the power supply terminal 64 located next to the power supply terminal 62.

In FIG. 8, for the multiple light-emitting elements 20 located between the light-emitting elements 20 at the two ends, a current may be caused to flow between the power supply terminal 64 connected to the first pad electrode 51 of each light-emitting element 20 and the power supply terminal 62 connected to the second pad electrode 52 of each light-emitting element 20. Thereby, the light-emitting layer 21*a* of the first semiconductor stacked body 21 of each light-emitting element 20 can be caused to emit light. Also, a current may be caused to flow between the power supply terminal 64 connected to the third pad electrode 53 of each light-emitting element 20 and the power supply terminal 62 connected to the second pad electrode 52 of each light-emitting element 20. Thereby, the light-emitting layer 22*a* of the second semiconductor stacked body 22 of each light-emitting element 20 can be caused to emit light.

By supplying a current by applying a potential difference between any two power supply terminals separated from each other in the first direction X, the light-emitting layers 21*a* and 22*a* of the multiple semiconductor stacked bodies 21 and 22 connected in series between the two power supply terminals can be caused to emit light.

In FIG. 8, for example, a current may be caused to flow between the power supply terminal 61 located at the left end and the power supply terminal 62 connected to the second pad electrode 52 of the light-emitting element 20 positioned second from the left. Thereby, the light-emitting layer 21*a* of the first semiconductor stacked body 21 and the light-emitting layer 22*a* of the second semiconductor stacked body 22 of the light-emitting element 20 at the left end and the light-emitting layer 21*a* of the first semiconductor stacked body 21 of the light-emitting element 20 positioned second from the left can be caused to emit light.

In FIG. 8, for example, a current may be caused to flow between the power supply terminal 62 connected to the second pad electrode 52 of the light-emitting element 20 positioned third from the left and the power supply terminal 62 connected to the second pad electrode 52 of the light-emitting element 20 positioned fifth from the left. Thereby, the light-emitting layer 22*a* of the second semiconductor stacked body 22 of the light-emitting element 20 positioned third from the left, the light-emitting layer 21*a* of the first semiconductor stacked body 21 and the light-emitting layer 22*a* of the second semiconductor stacked body 22 of the light-emitting element 20 positioned at the fourth from the left, and the light-emitting layer 21*a* of the first semiconductor stacked body 21 of the light-emitting element 20 positioned fifth from the left can be caused to emit light.

The number of semiconductor stacked bodies included in one light-emitting element 20 is not limited to two and may be three or more. Even when three or more semiconductor stacked bodies are included in one light-emitting element 20, if the number of semiconductor stacked bodies is n, the number of interconnect layers included in the one light-emitting element 20 is n+1, and the number of pad electrodes included in the one light-emitting element 20 is n+1.

Figure 9:
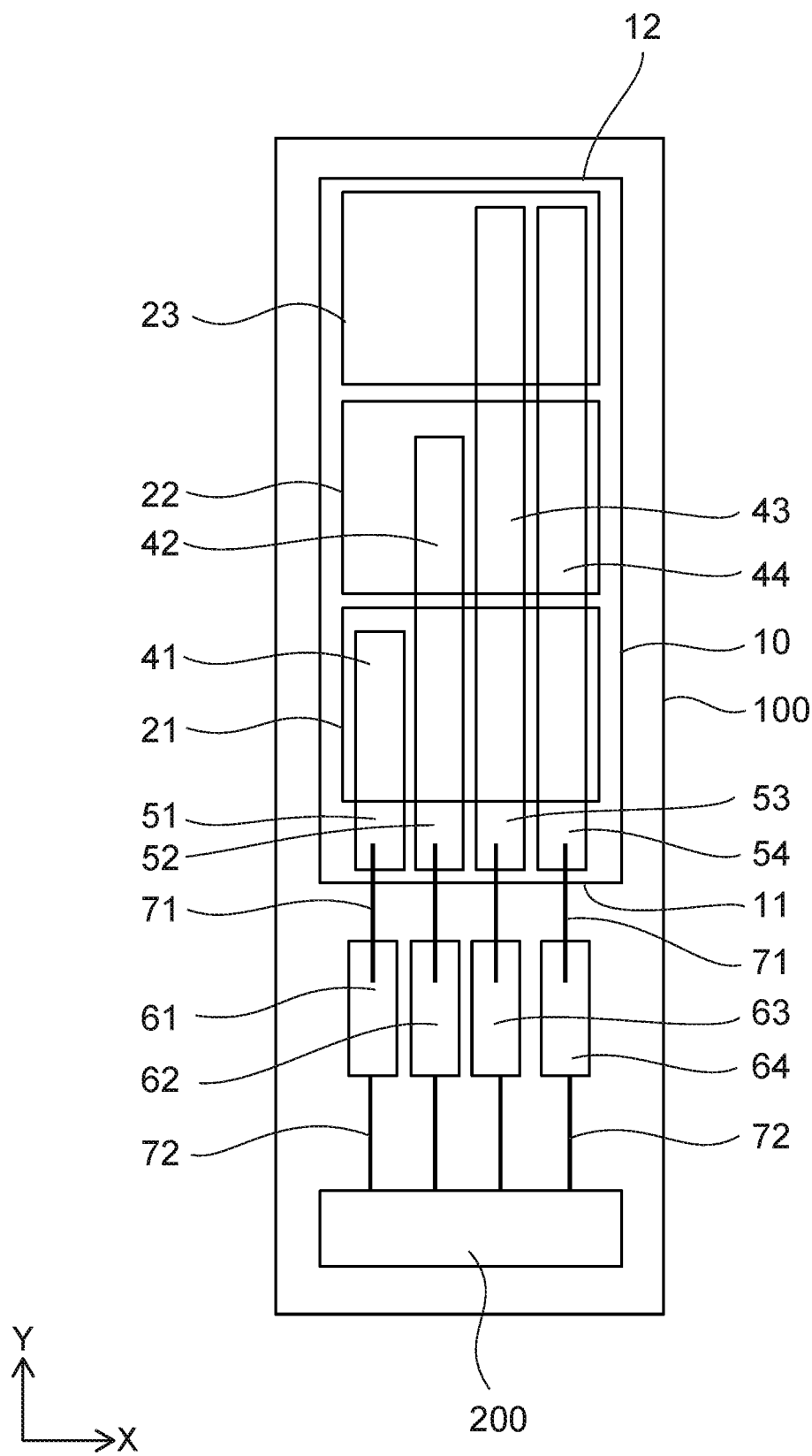
FIG. 9 is a schematic plan view showing an arrangement relationship of main components of a light-emitting device of still another embodiment of the invention.

FIG. 9 is a schematic plan view showing the arrangement relationship of the main components of a light-emitting device including a light-emitting element that includes, for example, the three semiconductor stacked bodies 21, 22, and 23, the four interconnect layers 41, 42, 43, and 44, and the four pad electrodes 51, 52, 53, and 54.

Compared to the configuration shown in FIG. 1, the configuration shown in FIG. 9 further includes the third semiconductor stacked body 23, the fourth interconnect layer 44, the fourth pad electrode 54, and the fourth power supply terminal 64.

The third semiconductor stacked body 23 has a configuration similar to those of the first semiconductor stacked body 21 and the second semiconductor stacked body 22, and includes a first semiconductor layer of the n-type, a second semiconductor layer of the p-type, and a light-emitting layer provided between the first semiconductor layer and the second semiconductor layer.

In a top-view shown in FIG. 9, the third semiconductor stacked body 23 is provided between the second semiconductor stacked body 22 and the second side 12 of the substrate 10. The third semiconductor stacked body 23 is separated from the second semiconductor stacked body 22.

The third interconnect layer 43 shown in FIG. 9 is connected not only to the second semiconductor layer 22p of the second semiconductor stacked body 22 but also to the first semiconductor layer of the third semiconductor stacked body 23. Similarly to the first interconnect layer 41, the third interconnect layer 43 is electrically connected to the first semiconductor layer of the third semiconductor stacked body 23 via the first electrode connected to island-shaped conduction portions of the first semiconductor layer of the third semiconductor stacked body 23.

The fourth interconnect layer 44 is connected to the second semiconductor layer of the third semiconductor stacked body 23. Similarly to the third interconnect layer 43 shown in FIG. 1, the fourth interconnect layer 44 is electrically connected to the second semiconductor layer of the third semiconductor stacked body 23 via the second electrode and the reflective film 33.

The fourth pad electrode 54 is provided at a portion of the fourth interconnect layer 44 between the first semiconductor stacked body 21 and the first side 11 of the substrate 10. The fourth pad electrode 54 is electrically connected to the fourth power supply terminal 64 via the conductive member 71. The fourth power supply terminal 64 is electrically connected to the control element 200 via the conductive member 72.

The first semiconductor stacked body 21, the second semiconductor stacked body 22, and the third semiconductor stacked body 23 are connected in series between the first power supply terminal 61 and the fourth power supply terminal 64.

Any one, two, or all of the light-emitting layer 21a of the first semiconductor stacked body 21, the light-emitting layer 22a of the second semiconductor stacked body 22, or the light-emitting layer of the third semiconductor stacked body 23 can be caused to emit light by supplying a current by applying a potential difference between any two power supply terminals of the first power supply terminal 61, the second power supply terminal 62, the third power supply terminal 63, or the fourth power supply terminal 64.

The first potential may be applied to the fourth power supply terminal 64, the second potential that is less than the first potential may be applied to the first power supply terminal 61, and the potential of the second power supply terminal 62 and the potential of the third power supply terminal 63 may be floating. Thereby, the light-emitting layer 21a of the first semiconductor stacked body 21, the light-emitting layer 22a of the second semiconductor stacked body 22, and the light-emitting layer of the third semiconductor stacked body 23 emit light simultaneously.

The first potential may be applied to the second power supply terminal 62, the second potential that is less than the first potential may be applied to the first power supply terminal 61, and the potentials of the third power supply terminal 63 and the fourth power supply terminal 64 may be floating. Thereby, the light-emitting layer 21a of the first semiconductor stacked body 21 emits light. The light-emitting layer 22a of the second semiconductor stacked body 22 and the light-emitting layer of the third semiconductor stacked body 23 do not emit light.

The first potential may be applied to the third power supply terminal 63, the second potential that is less than the first potential may be applied to the second power supply terminal 62, and the potentials of the first power supply terminal 61 and the fourth power supply terminal 64 may be floating. Thereby, the light-emitting layer 22a of the second semiconductor stacked body 22 emits light. The light-emitting layer 21a of the first semiconductor stacked body 21 and the light-emitting layer of the third semiconductor stacked body 23 do not emit light.

The first potential may be applied to the fourth power supply terminal 64, the second potential that is less than the first potential may be applied to the third power supply terminal 63, and the potentials of the first power supply terminal 61 and the second power supply terminal 62 may be floating. Thereby, the light-emitting layer of the third semiconductor stacked body 23 emits light. The light-emitting layer 21a of the first semiconductor stacked body 21 and the light-emitting layer 22a of the second semiconductor stacked body 22 do not emit light.

The first potential may be applied to the third power supply terminal 63, the second potential that is less than the first potential may be applied to the first power supply terminal 61, and the potentials of the second power supply terminal 62 and the fourth power supply terminal 64 may be floating. Thereby, the light-emitting layer 22a of the second semiconductor stacked body 22 and the light-emitting layer 21a of the first semiconductor stacked body 21 emit light. The light-emitting layer of the third semiconductor stacked body 23 does not emit light.

The first potential may be applied to the fourth power supply terminal 64, the second potential that is less than the first potential may be applied to the second power supply terminal 62, and the potentials of the first power supply terminal 61 and the third power supply terminal 63 may be floating. Thereby, the light-emitting layer of the third semiconductor stacked body 23 and the light-emitting layer 22a of the second semiconductor stacked body 22 emit light. The light-emitting layer 21a of the first semiconductor stacked body 21 does not emit light.

Figure 10:
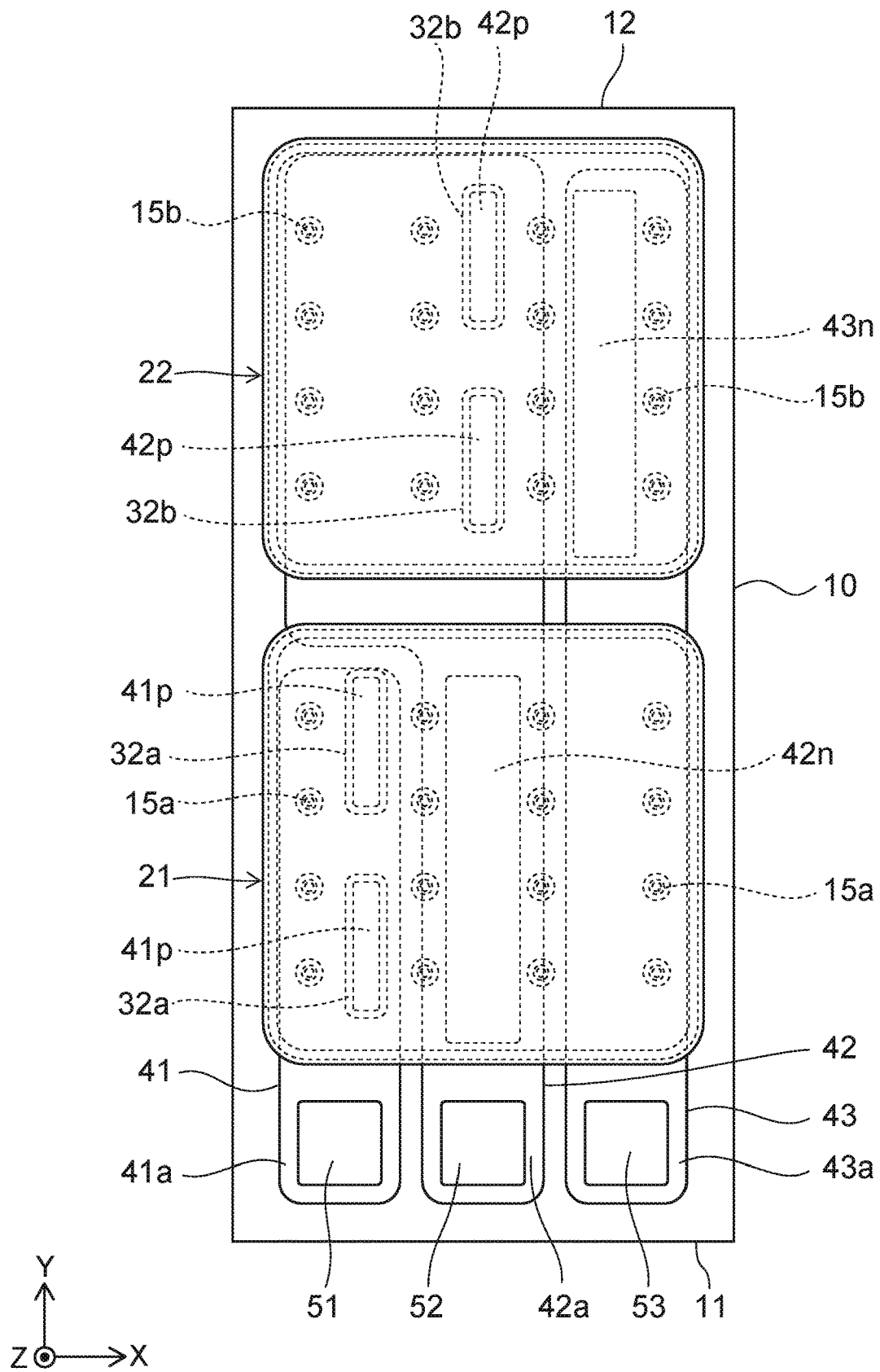
FIG. 10 is a schematic plan view illustrating another arrangement relationship of the components of the light-emitting element shown in FIG. 2.

FIG. 10 is a schematic plan view illustrating another arrangement relationship of the components of the light-emitting element 20 shown in FIG. 2.

The first interconnect layer 41 includes a connection portion 41p connected to the second electrode 32a and is electrically connected to the second semiconductor layer 21p of the first semiconductor stacked body 21 via the second electrode 32a and the reflective film 33.

The second interconnect layer 42 includes the connection portion 42n connected to the first electrode 31a and is electrically connected to the first semiconductor layer 21n of the first semiconductor stacked body 21 via the first electrode 31a and the conduction portions 15a. The second interconnect layer 42 also includes the connection portion 42p connected to the second electrode 32b and is electrically connected to the second semiconductor layer 22p of the second semiconductor stacked body 22 via the second electrode 32b and the reflective film 33.

The third interconnect layer 43 includes a connection portion 43n connected to the first electrode 31b and is electrically connected to the first semiconductor layer 22n of the second semiconductor stacked body 22 via the first electrode 31b and the conduction portions 15b.

The levels of the potentials applied to any two power supply terminals to supply a forward current to the light-emitting layers 21a and 22a in the configuration shown in FIG. 10 are the reverse of those of the configuration shown in FIG. 2.

Figure 11:
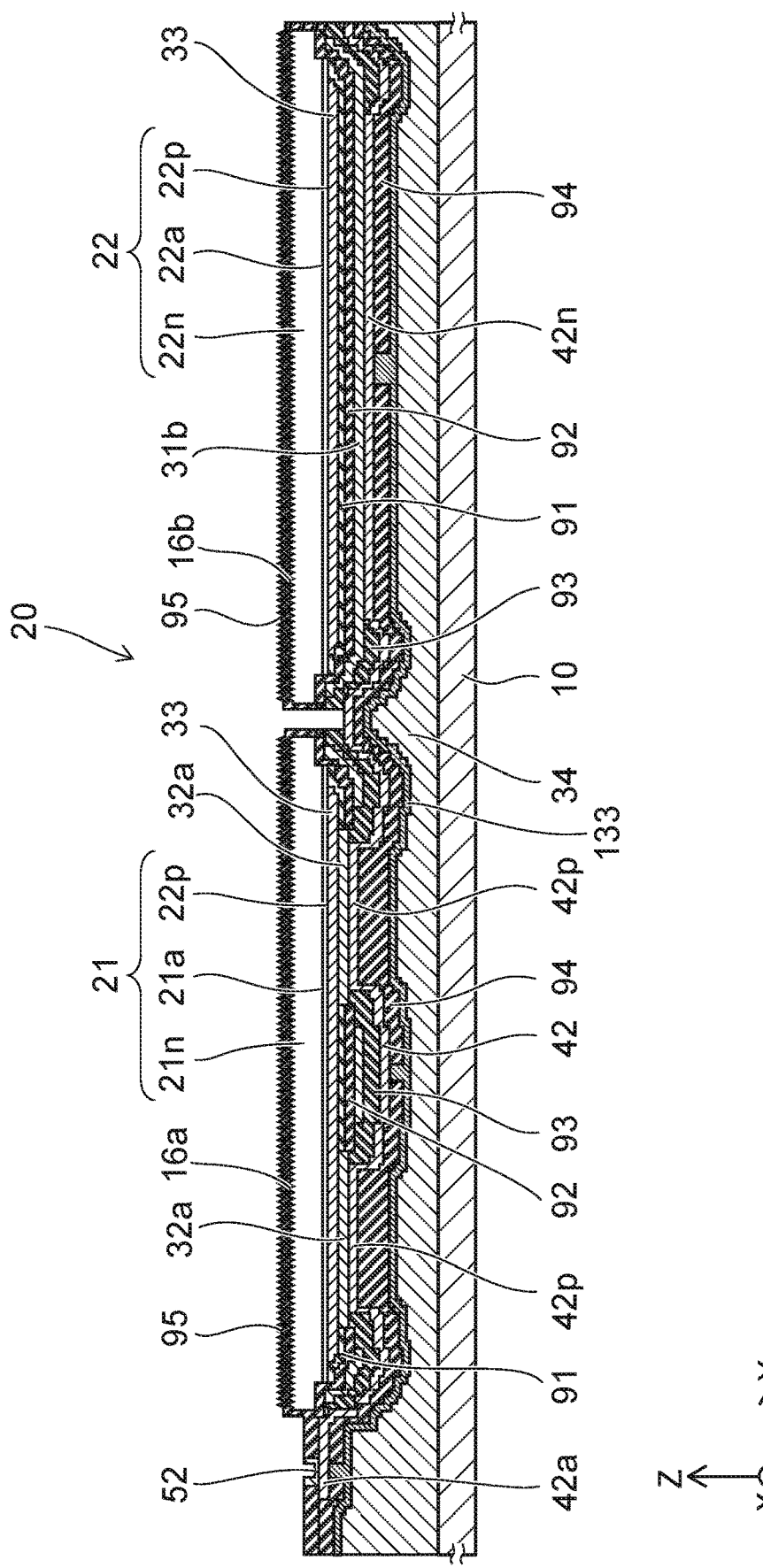
FIG. 11 is a schematic cross-sectional view showing an arrangement relationship of main components of a light-emitting device of still another embodiment of the invention.

FIG. 11 is a schematic cross-sectional view illustrating another arrangement relationship of the components of the light-emitting element 20 shown in FIG. 5.

A third electrode 133 is provided at the surface of the insulating film 94. The third electrode 133 contacts the bonding layer 34. Openings are provided in portions of the insulating film 94, and the third electrode 133 is electrically connected through the openings to the second interconnect layer 42 provided at the first semiconductor stacked body 21, the second interconnect layer 42 provided at the second semiconductor stacked body 22, and the second interconnect layer 42 positioned directly under the second pad electrode 52. The forward voltage can be reduced by providing the conduction path via the second interconnect layer 42 and the conduction path via the third electrode 133.

Embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Besides, within the scope of the spirit of the present invention, one skilled in the art can conceive various modifications, and the modifications fall within the scope of the present invention.

What is claimed is:

1. A light-emitting device comprising:
    a circuit board; and
    a light-emitting element mounted on the circuit board, the light-emitting element comprising:
        a substrate provided on the circuit board, the substrate having a first side along a first direction and a second side along the first direction, wherein a second direction from the first side toward the second side being is orthogonal to the first direction;
        n semiconductor stacked bodies (n being a natural number of 2 or more) provided on the substrate, the n semiconductor stacked bodies comprising a first semiconductor stacked body and a second semiconductor stacked body that are electrically insulated from each other, each of the semiconductor stacked bodies comprising:
            a first semiconductor layer of a first conductivity type,
            a second semiconductor layer of a second conductivity type, and
            a light-emitting layer provided between the first semiconductor layer and the second semiconductor layer,
        wherein the first semiconductor stacked body is provided between the first side and the second semiconductor stacked body in a top-view, and
        wherein the second semiconductor stacked body is provided between the first semiconductor stacked body and the second side in the top-view;
        n+1 interconnect layers comprising at least:
            a first interconnect layer connected to the first semiconductor layer of the first semiconductor stacked body,
            a second interconnect layer connected to the second semiconductor layer of the first semiconductor stacked body and the first semiconductor layer of the second semiconductor stacked body, and
            a third interconnect layer connected to the second semiconductor layer of the second semiconductor stacked body; and
        n+1 pad electrodes provided between the first side and the first semiconductor stacked body, the n+1 pad electrodes comprising:
            a first pad electrode connected to the first interconnect layer,
            a second pad electrode connected to the second interconnect layer, and
            a third pad electrode connected to the third interconnect layer.

2. The light-emitting device according to claim 1, wherein:
    the circuit board comprises:
        a first power supply terminal connected to the first pad electrode,
        a second power supply terminal connected to the second pad electrode, and
        a third power supply terminal connected to the third pad electrode.

3. The light-emitting device according to claim 2, wherein:
    the first pad electrode, the second pad electrode, and the third pad electrode are arranged in the first direction, and
    the second pad electrode is positioned between the first pad electrode and the third pad electrode.

4. The light-emitting device according to claim 3, wherein:
    the first interconnect layer, the second interconnect layer, and the third interconnect layer are arranged in the first direction, and
    the second interconnect layer is positioned between the first interconnect layer and the third interconnect layer.

5. The light-emitting device according to claim 4, wherein:
    the plurality of semiconductor stacked bodies of the plurality of light-emitting elements are connected in series by the plurality of interconnect layers and the plurality of power supply terminals.

6. The light-emitting device according to claim 4, further comprising:
    a control element mounted on the circuit board,
    wherein each of the plurality of power supply terminals is connected to the control element.

7. The light-emitting device according to claim 3, wherein:
    the light-emitting element includes a first electrode and a second electrode provided on each of the semiconductor stacked bodies, the first electrode being connected to the first semiconductor layer, the second electrode being connected to the second semiconductor layer,
    the first interconnect layer is connected to the first electrode of the first semiconductor stacked body, the second interconnect layer is connected to the second electrode of the first semiconductor stacked body and the first electrode of the second semiconductor stacked body, and the third interconnect layer is connected to the second electrode of the second semiconductor stacked body.

8. The light-emitting device according to claim 3, wherein:

a width of the second interconnect layer in the first direction at the second semiconductor stacked body is greater than a width of the second interconnect layer in the first direction at the first semiconductor stacked body.

9. The light-emitting device according to claim 2, wherein:

the first interconnect layer, the second interconnect layer, and the third interconnect layer are arranged in the first direction, and the second interconnect layer is positioned between the first interconnect layer and the third interconnect layer.

10. The light-emitting device according to claim 2, further comprising:

a control element mounted on the circuit board, wherein each of the first power supply terminal, the second power supply terminal, and the third power supply terminal is connected to the control element.

11. The light-emitting device according to claim 2, wherein:

the light-emitting element includes a first electrode and a second electrode provided on each of the semiconductor stacked bodies, the first electrode being connected to the first semiconductor layer, the second electrode being connected to the second semiconductor layer, the first interconnect layer is connected to the first electrode of the first semiconductor stacked body, the second interconnect layer is connected to the second electrode of the first semiconductor stacked body and the first electrode of the second semiconductor stacked body, and the third interconnect layer is connected to the second electrode of the second semiconductor stacked body.

12. The light-emitting device according to claim 2, wherein:

a width of the second interconnect layer in the first direction at the second semiconductor stacked body is greater than a width of the second interconnect layer in the first direction at the first semiconductor stacked body.

13. The light-emitting device according to claim 1, wherein:

a plurality of the light-emitting elements are arranged along the first direction, the circuit board comprises a plurality of power supply terminals connected to the first pad electrode, the second pad electrode, and the third pad electrode of each of the light-emitting elements, and the third pad electrode of one of two light-emitting elements of the plurality of light-emitting elements next to each other in the first direction, and the first pad electrode of the other light-emitting element of the two light-emitting elements are connected to a same power supply terminal.

14. The light-emitting device according to claim 13, wherein:

the light-emitting element includes a first electrode and a second electrode provided on each of the semiconductor stacked bodies, the first electrode being connected to the first semiconductor layer, the second electrode being connected to the second semiconductor layer, the first interconnect layer is connected to the first electrode of the first semiconductor stacked body, the second interconnect layer is connected to the second electrode of the first semiconductor stacked body and the first electrode of the second semiconductor stacked body, and the third interconnect layer is connected to the second electrode of the second semiconductor stacked body.

15. The light-emitting device according to claim 13, wherein:

a width of the second interconnect layer in the first direction at the second semiconductor stacked body is greater than a width of the second interconnect layer in the first direction at the first semiconductor stacked body.

16. The light-emitting device according to claim 1, wherein:

the light-emitting element includes a first electrode and a second electrode provided on each of the semiconductor stacked bodies, the first electrode being connected to the first semiconductor layer, the second electrode being connected to the second semiconductor layer, the first interconnect layer is connected to the first electrode of the first semiconductor stacked body, the second interconnect layer is connected to the second electrode of the first semiconductor stacked body and the first electrode of the second semiconductor stacked body, and the third interconnect layer is connected to the second electrode of the second semiconductor stacked body.

17. The light-emitting device according to claim 1, wherein:

a width of the second interconnect layer in the first direction at the second semiconductor stacked body is greater than a width of the second interconnect layer in the first direction at the first semiconductor stacked body.

* * * * *